US012721076B2

(12) United States Patent
Chen et al.

(10) Patent No.: US 12,721,076 B2
(45) Date of Patent: Aug. 25, 2026

(54) METHOD FOR MANUFACTURING SEMICONDUCTOR STRUCTURE

(71) Applicant: TAIWAN SEMICONDUCTOR MANUFACTURING COMPANY, LTD., Hsinchu (TW)

(72) Inventors: Wen-Yen Chen, Hsinchu (TW); Tsai-Yu Huang, Taoyuan City (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 394 days.

(21) Appl. No.: 18/415,574

(22) Filed: Jan. 17, 2024

(65) Prior Publication Data

US 2025/0232980 A1 Jul. 17, 2025

(51) Int. Cl.

*H01L 21/304* (2006.01)
*H10P 52/00* (2026.01)
*H10W 20/00* (2026.01)

(52) U.S. Cl.

CPC ............ *H10P 52/00* (2026.01); *H10W 20/01* (2026.01)

(58) Field of Classification Search

CPC ......... H10P 52/00; H10P 54/00; H10W 20/01
See application file for complete search history.

(56) References Cited

U.S. PATENT DOCUMENTS

| | | | | |
|---|---|---|---|---|
| 10,818,488 | B2 * | 10/2020 | Chiang | H10P 52/00 |
| 2021/0391351 | A1 * | 12/2021 | Takimoto | H10B 41/10 |
| 2022/0271023 | A1 * | 8/2022 | Wu | H10P 54/00 |
| 2022/0367407 | A1 * | 11/2022 | Lin | B23K 26/362 |
| 2024/0047216 | A1 * | 2/2024 | Wang | H10P 50/691 |
| 2024/0112928 | A1 * | 4/2024 | Lee | H10P 72/0428 |
| 2025/0167150 | A1 * | 5/2025 | Kuo | H10P 52/00 |

* cited by examiner

*Primary Examiner* — Thao P Le
(74) *Attorney, Agent, or Firm* — Maschoff Brennan

(57) ABSTRACT

A method for manufacturing a semiconductor structure is provided. The method includes forming a transistor over the first wafer; bonding a first wafer to a second wafer; trimming an edge region of the first wafer along a circular trimming path, wherein a center of the circular trimming path is offset from a center of the second wafer in a top view; after trimming the edge region of the first wafer, thinning down the first wafer; and after thinning down the first wafer, forming a backside conductive feature electrically connected to the transistor.

20 Claims, 13 Drawing Sheets

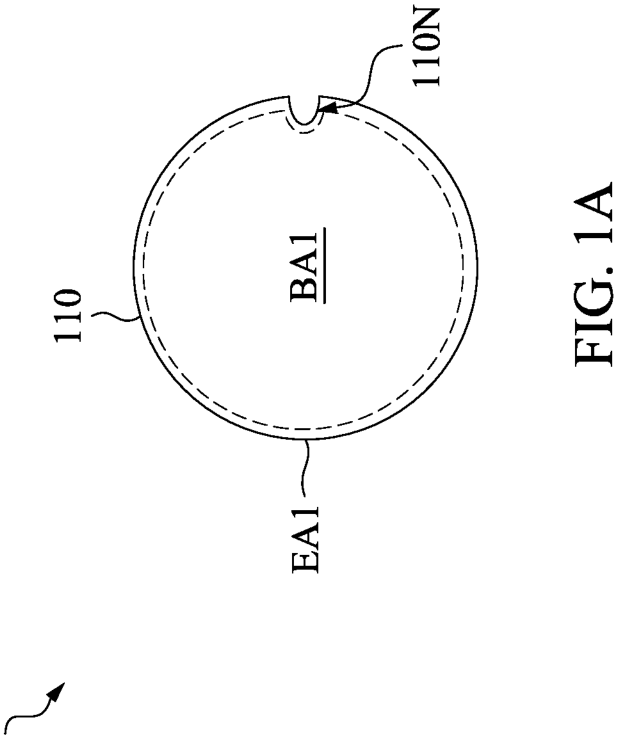
FIG. 1A
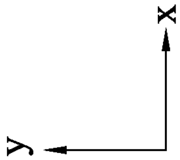

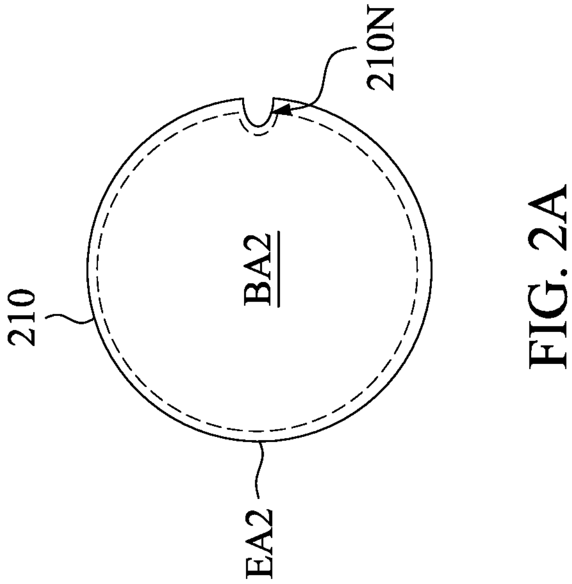
FIG. 2A
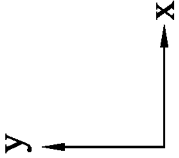

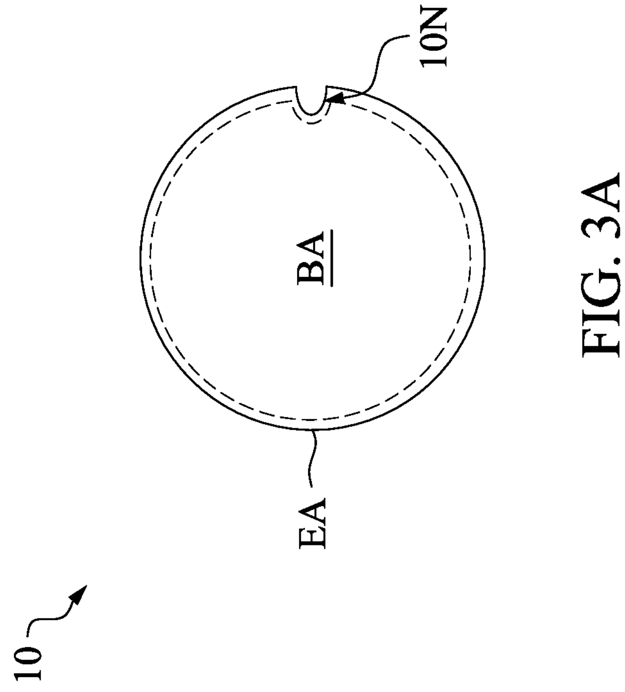
FIG. 3A
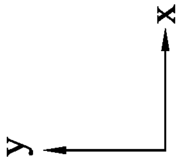

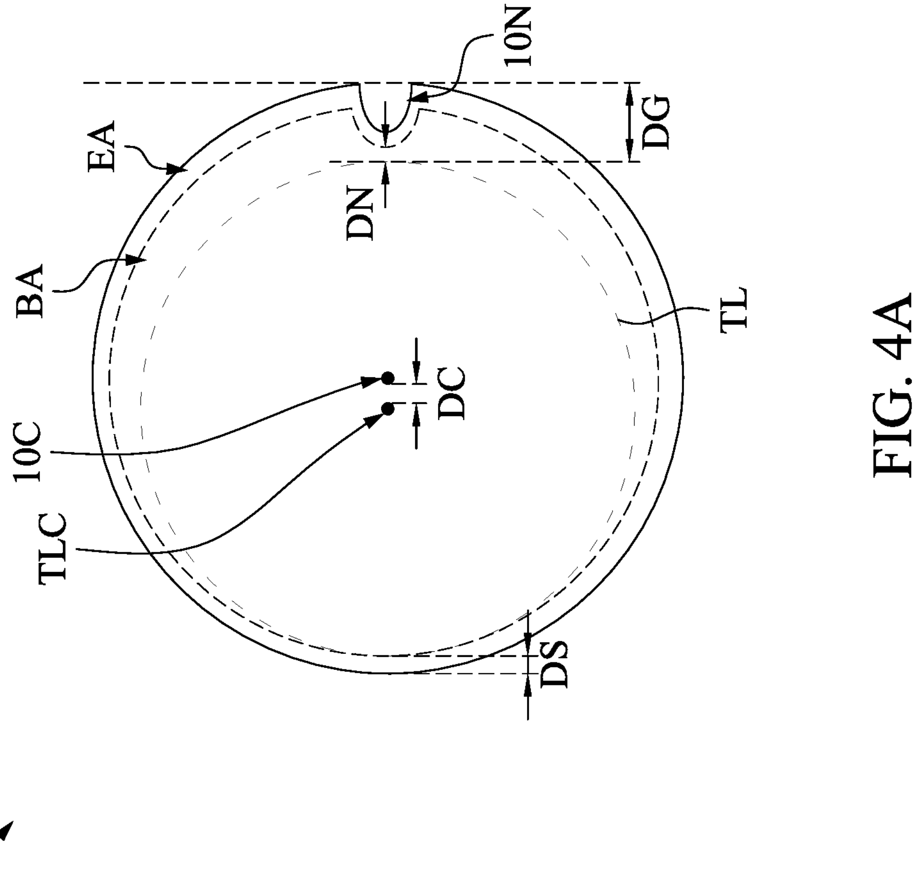
FIG. 4A
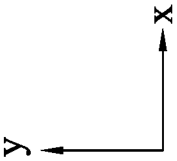

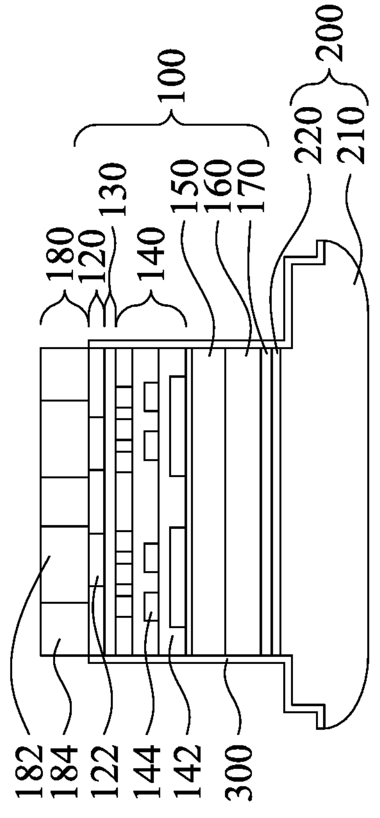
FIG. 7
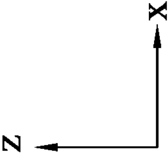

METHOD FOR MANUFACTURING SEMICONDUCTOR STRUCTURE

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconductor material. After fabricating integrated circuits on a first wafer, the first wafer may be bonded to a second wafer. Wafer edge trimming may be used to remove and/or prevent damage to the first and second wafers after bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-7 illustrate a method of manufacturing a semiconductor structure at various stages in accordance with some embodiments.

DETAILED DESCRIPTION

Figure 1B:
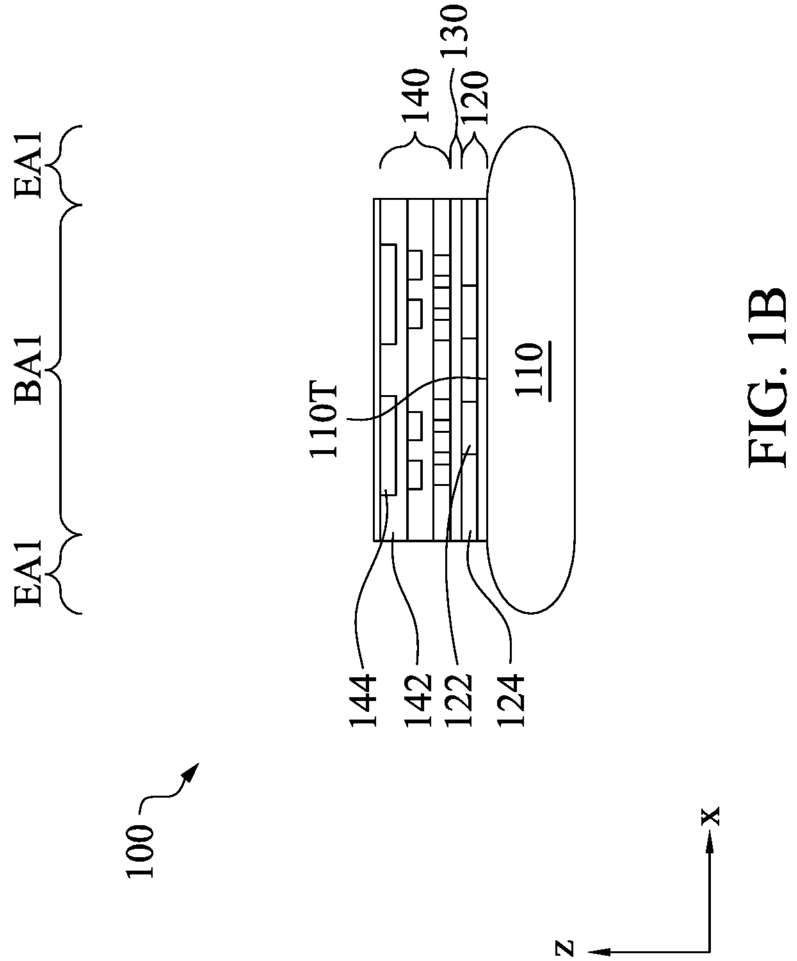

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafer thinning is used in conjunction with wafer bonding to provide a semiconductor chip including a vertical stack of at least two semiconductor dies. A first wafer including first semiconductor devices may be bonded to a second wafer including second semiconductor devices. One of the two bonded wafers may be thinned after bonding. Bonded and thinned semiconductor wafers may be subsequently diced to form multiple semiconductor chips, which may have higher density, multiple functions, and/or faster operational speed provided through vertical bonding of at least two semiconductor dies. Edge regions of a wafer that do not include bonded portions of the semiconductor dies may be edge-trimmed during a wafer thinning process to prevent the bonded wafer assembly from peeling.

Figure 4B:
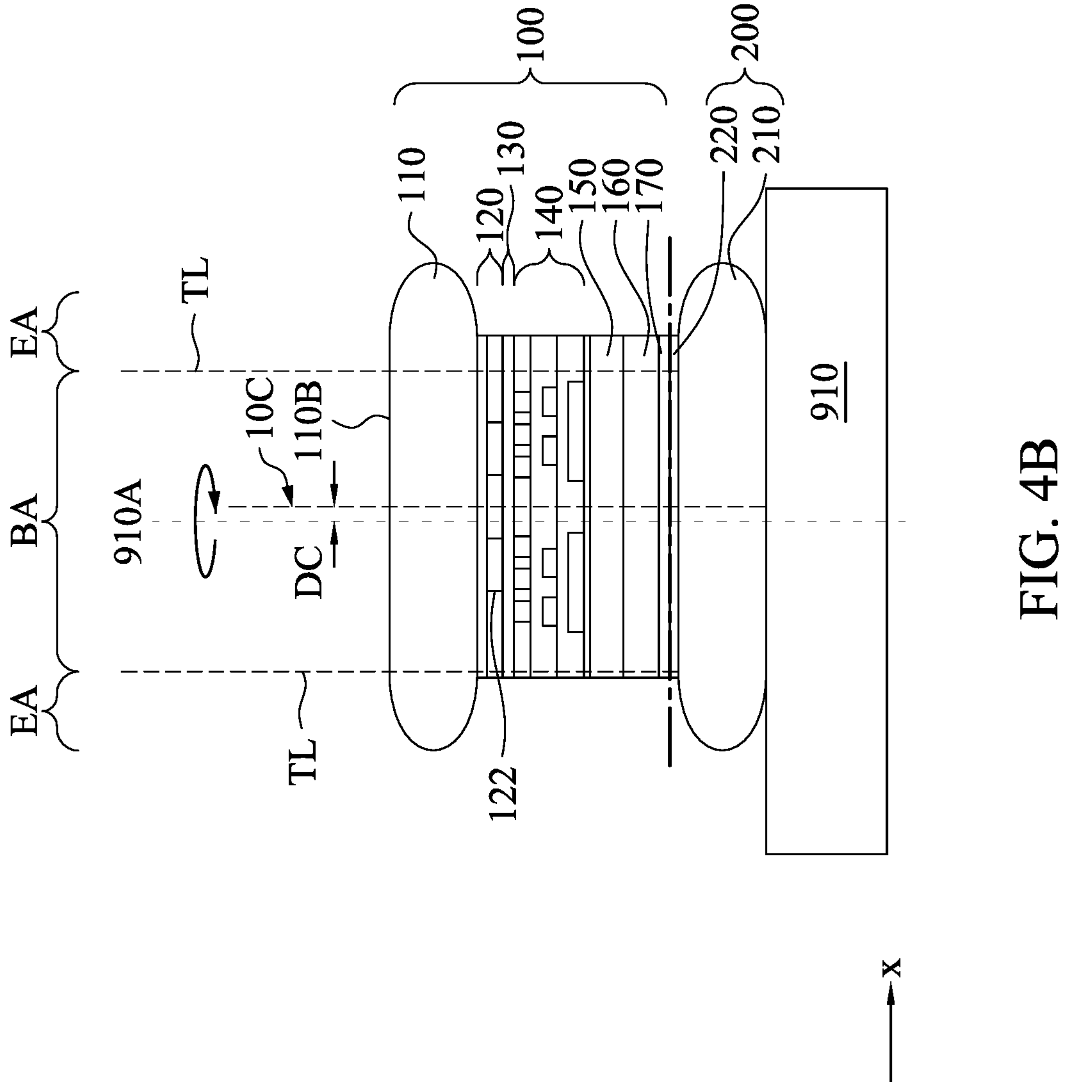
Figure 5B:
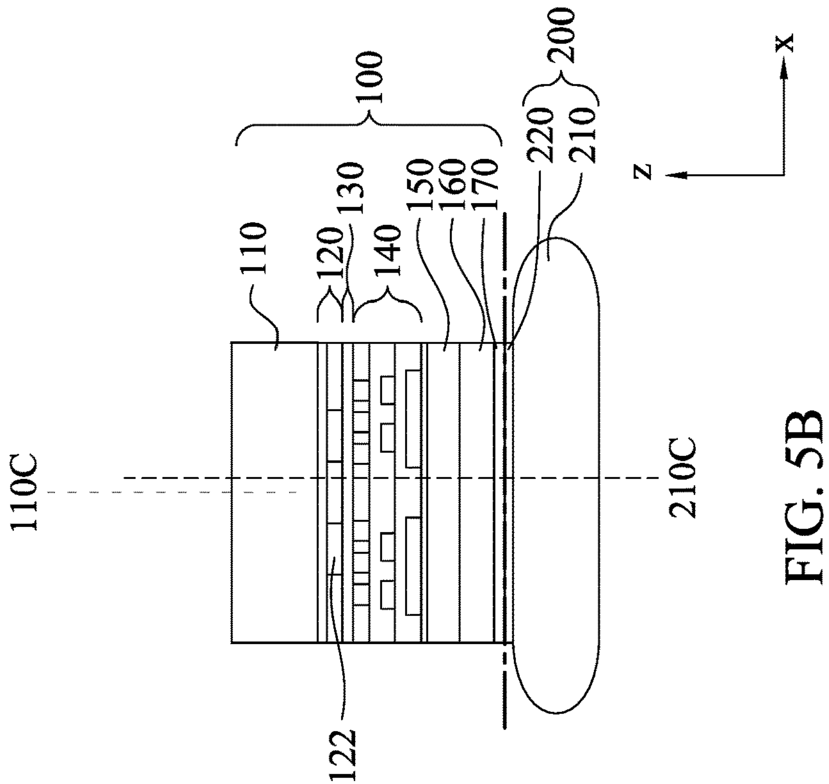
Figure 5A:
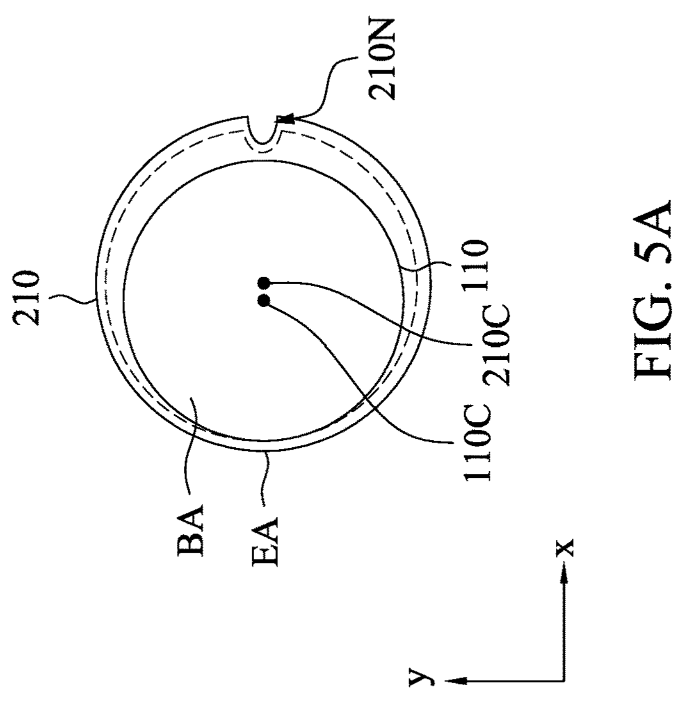
Figure 6:
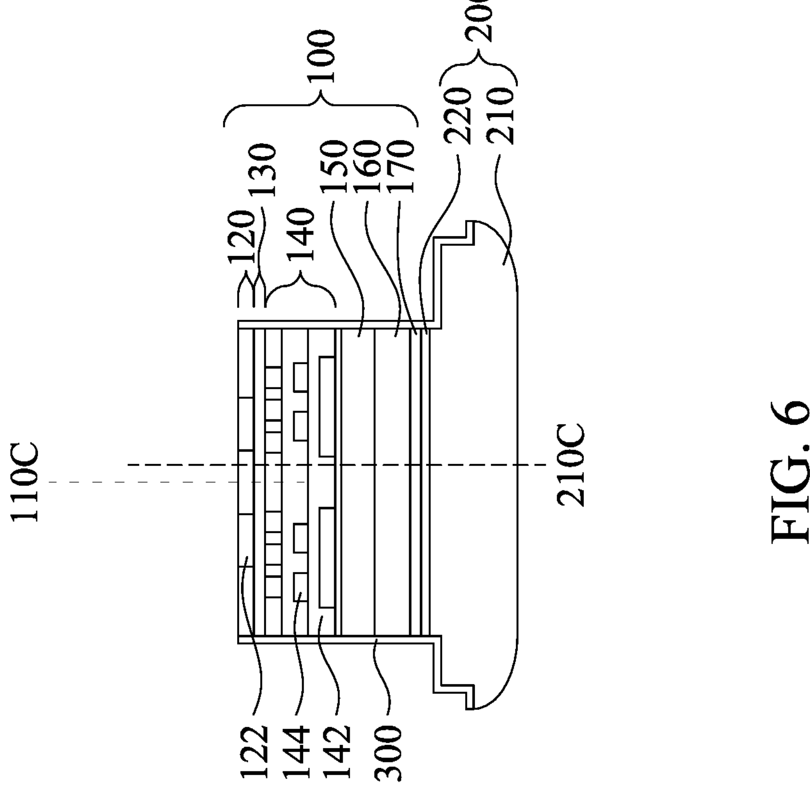

FIGS. 1A-7 illustrate a method of manufacturing a semiconductor structure at various stages in accordance with some embodiments. FIGS. 1A, 2A, 3A, 4A, and 5A are top views of the semiconductor structure at various stages in accordance with some embodiments. FIGS. 1B, 2B, 3B, 4B, and 5B are cross-sectional views of the semiconductor structure of FIGS. 1A, 2A, 3A, 4A, and 5A, for example, taken along the direction x. FIGS. 6 and 7 are cross-sectional views of the semiconductor structure in accordance with some embodiments. It is understood that additional steps may be provided before, during, and after the steps shown in FIGS. 1A-7, and some of the steps described below can be replaced or eliminated for additional embodiments of the method. The order of the operations/processes may be interchangeable.

Reference is made to FIGS. 1A and 1B. A first wafer 110 is provided. The first wafer 110 may include a semiconductor material such as, for example, silicon, germanium, or the like. In some embodiments, the first wafer 110 has a notch 110N extending from the outermost periphery of the first wafer 110 into the first wafer 110. In some embodiments, the notch 110N may have a triangular shape in the top view. In some other embodiments, the notch 110N may have other shapes such as rectangles in the top view.

A front-end-of-line (FEOL) structure 120, a middle-end-of-line (MEOL) structure 130, and a back-end-of-line (BEOL) structure 140 are formed over the first wafer 110 in a sequence. In the context, the first wafer 110 and the FEOL structure 120, the MEOL structure 130, and the BEOL structure 140 formed thereon may be referred to as a first semiconductor structure 100. The FEOL structure 120 may include active devices 122, such as transistors. In some embodiments, the active devices are formed as a fin-type FET (finFET) or a gate-all-around (GAA) FET. The FEOL structure 120 may include an interlayer dielectric layer 124 surrounding the active devices 122. The MEOL structure 130 may include contact plugs embedded in a dielectric layer over the interlayer dielectric layer 124 and the active devices 122, and the contact plugs are standing on gates and/or the source/drain structure of the active devices 122. The BEOL structure 140 may include multilevel interconnect structure. For example, the BEOL structure 140 may include a stack of dielectric layers 142 and conductive elements 144 formed in the stack of dielectric layers 142 over the MEOL structure 130. The conductive elements 144 may include conductive traces and vias. The conductive traces each extend over one of the dielectric layers 142. The vias each penetrate through one or more of the dielectric layers 142 and establish electrical contact with one or more of the conductive traces. The conductive element 144 is electrically connected to the active devices in the FEOL structure 120, for example, through the contact plugs in the MEOL structure 130.

In some embodiments, the first wafer 110 has a top surface 110T, a bottom surface 110B opposite to the top surface 110T, and an edge 110S connecting between the top surface 110T and the bottom surface 110B. For example, a side where FEOL structure 120, the MEOL structure 130, and the BEOL structure 140 are located may be referred to the frontside of the first wafer 110, and the opposite side where the bottom surface 110B is located may be referred to the backside of the first wafer 110. The first wafer 110 may be of any appropriate size and shape. In some embodiments, the first wafer 110 is a substantially circular wafer. The top surface 110T and the bottom surface 110B may be substantially flat surfaces. The edge 110S in FIG. 1B is illustrated as curve shaped or a rounded edge. In other embodiments, the edge 110S of the first wafer 110S may be a chamfered edge or a beveled edge.

The first wafer 110 may have a bonding region BA1 corresponding to the top surface 110T and the bottom surface 110B and an edge region EA1 surrounding the bonding region BA1 and corresponding to the edge 110S when viewed from above. The bonding region BA1 may be laterally offset from the outermost periphery of the first wafer 110 by a lateral offset distance. In some embodiments, both the bonding region BA1 and the edge region EA1 may have a notch profile as the notch 110N in the top view.

In some embodiments, the FEOL structure 120, the MEOL structure 130, and the BEOL structure 140 may be formed over the bonding region BA1 of the first wafer 110 (i.e., the top surface 110T), while the edge region EA1 of the first wafer 110 (i.e., the edge 110S) is substantially free from materials of the FEOL structure 120, the MEOL structure 130, and the BEOL structure 140. In some alternative embodiments, the FEOL structure 120, the MEOL structure 130, and the BEOL structure 140 may be formed over the bonding region BA1 of the first wafer 110 (i.e., the top surface 110T), while some residues of the FEOL structure 120, the MEOL structure 130, and the BEOL structure 140 formed over the edge region EA1 of the first wafer 110 (i.e., the edge 110S).

Figure 2B:
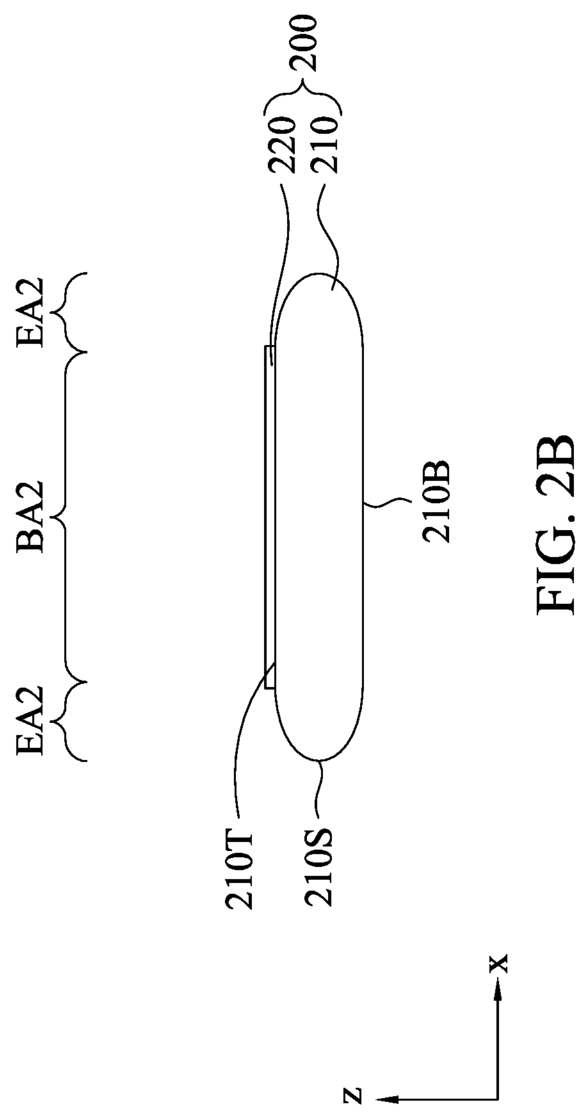

Reference is made to FIGS. 2A and 2B. A second semiconductor structure 200 is provided. The second semiconductor structure 200 may include a second wafer 210 and a bonding layer 220. The second wafer 210 may include a semiconductor material such as, for example, silicon, germanium, or the like. The second wafer 210 may have substantially the same size (or the same diameter) as that of the first wafer 110. In some embodiments, the second wafer 210 has a notch 210N extending from the outermost periphery of the second wafer 210 into the second wafer 210. In some embodiments, the notch 210N has a triangular shape in the top view. In some other embodiments, the notch 210N may have other shapes such as rectangles in the top view. In some embodiments, the bonding layer 220 may be an oxide layer (e.g., silicon oxide layer) formed over the second wafer 210, for example, by suitable thermal oxidation process. In some other embodiments, the bonding layer 220 may include low-pressure chemical-vapor-deposited (LPCVD) oxide, undoped silicon oxide (USG), and or density plasma (HDP) oxide.

In some embodiments, the first wafer 110 and the second wafer 210 have overall circular shapes.

Similar to the first wafer 110 (referring to FIGS. 1A and 1B), the second wafer 210 has a top surface 210T, a bottom surface 210B opposite to the top surface 210T, and an edge 210S connecting between the top surface 210T and the bottom surface 210B. The second wafer 210 may be of any appropriate size and shape. In some embodiments, the second wafer 210 a substantially circular wafer. The top surface 210T and the bottom surface 210B may be substantially flat surfaces. The edge 210S in FIG. 2B is illustrated as curve shaped or a rounded edge. In other embodiments, the edge 210S of the second wafer 210 may be a chamfered edge or a beveled edge.

The second wafer 210 may have a bonding region BA2 corresponding to the top surface 210T and the bottom surface 210B and an edge region EA2 surrounding the bonding region BA2 and corresponding to the edge 210S when viewed from above. The bonding region BA2 may be laterally offset from the outermost periphery of the second wafer 210 wafer 210 by a lateral offset distance. In some embodiments, both the bonding region BA2 and the edge region EA2 may have a notch profile as the notch 210N in the top view.

Figure 3B:
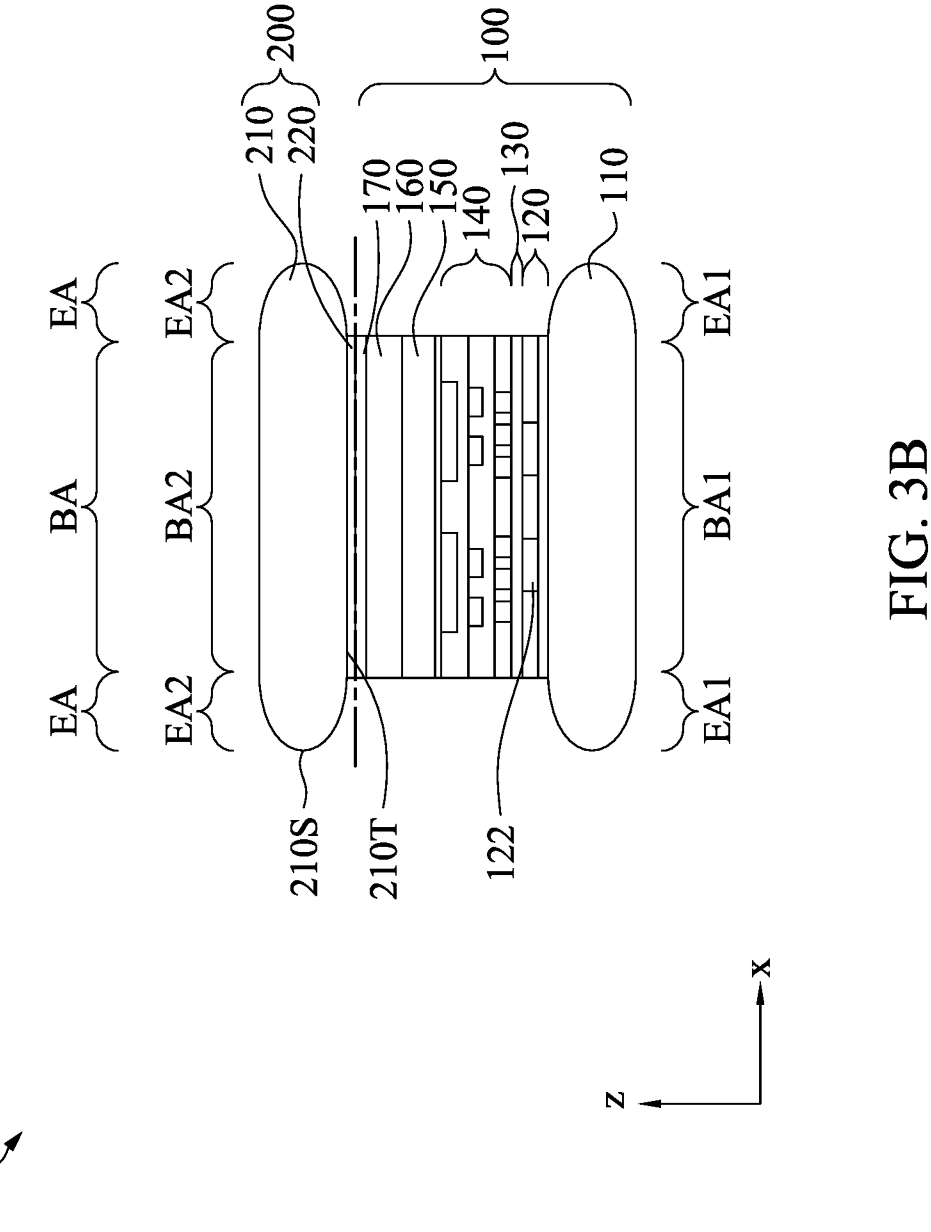

Reference is made to FIGS. 3A and 3B. The first semiconductor structure 100 is bonded to a second semiconductor structure 200. Prior to the bonding process, a top metal layer 150 and one or more bonding layers (e.g., a first dielectric layer 160 and a second dielectric layer 170) are formed over the BEOL structure 140 in a sequence. In some other embodiments, the bonding layer (e.g., a first dielectric layer 160 and a second dielectric layer 170) may include low-pressure chemical-vapor-deposited (LPCVD) oxide, undoped silicon oxide (USG), and or density plasma (HDP) oxide. For example, the first dielectric layer 160 may include undoped silicon oxide (USG). The second dielectric layer 170 may include high density plasma (HDP) oxide, which may include silicon oxide. In some embodiments, a thickness of the second dielectric layer 170 may be greater than that of the first dielectric layer 160. After the formation of the first and second dielectric layers 160 and 170, a planarization process (e.g., a chemical mechanical polish process) may be performed to planarize a top surface of the second dielectric layer 170 and thin the second dielectric layer 170. After the planarization process, a thickness of the second dielectric layer 170 may be less than that of the first dielectric layer 160.

The bonding process may include bonding the second dielectric layer 170 of the first semiconductor structure 100 to the bonding layer 220 of the second semiconductor structure 200. A cleaning process to the topmost layers of the first semiconductor structure 100 and the second semiconductor structure 200 may be performed prior to the bonding process, thereby removing particles thereon. The bonding process is performed such that the second wafer 210 is aligned with the first wafer 110, and the notch 210N of the second wafer 210 is aligned with the notch 110N of the first wafer 110. Stated differently, a center of the second wafer 210 is substantially aligned with a center of the first wafer 110. For example, the bonding region BA1 of the first wafer 110 overlaps the bonding region BA2 of the second wafer 110. After the bonding process, a bonded structure 10 is formed. The bonded structure 10 may have a bonding region BA corresponding to the bonding regions BA1 and BA2 and an edge region EA corresponding to the edge regions EA1 and EA2. And, both the bonding region BA and the edge region EA may have a profile of notch 10N as the notches 110N and 210N in FIGS. 1A and 2A.

After the bonding process, a post-bond annealing process may be performed to strengthen the bonding between the first wafer 110 and the second wafer 210. The temperature of the annealing process may depend on the design requirement. For example, the higher the temperature of the annealing process, the greater the resulting bonding strength. In other embodiments in which the electrical components are distributed in the first wafer 110, the temperature of the annealing process is limited to relatively low so as not to damage the electrical components. In some other embodiments, the first wafer 110 and the second wafer 210 may be bonded though a bonding layer (e.g., the second dielectric layer 170 and the bonding layer 220) formed on the bonding interface of the first wafer 110 or on the second wafer 210 before bringing the wafers into contact. In some embodiments, a molecular bonding technique may be employed. For example, bringing the second dielectric layer 170 and the bonding layer 220 into direct contact, and the first semiconductor structure 100 and the second semiconductor structure 200 are bonded through Van der Waals force without using a specific bonding material or an adhesive.

Reference is made to FIGS. 4A and 4B. After the bonding process, the bonded structure 10 is flipped upside down. After flipping, the first wafer 110 would be a device wafer up-side-down and the second wafer 210 would be a carrier wafer supporting the device wafer. For example, the backside of the first wafer 110 (e.g., the surface 110B) faces upward. Subsequently, an edge trimming process is performed to cut the edge region EA of the bonded structure 10, for example, along the trimming line TL. The trimming line/path TL may form a circle spaced apart from the notch 10N in the top view of FIG. 4A. Through the design, the notch 110N of the first wafer 110 may be entirely removed, thereby preventing an edge cracking issue (or chipping issue) in subsequent grinding process. In some embodiments, the edge trimming process may terminate at a top surface of the second wafer 210. Stated differently, portions of the first wafer 110 and the layers between the first and second wafers 110 and 210 that are outside the trimming line/path TL are removed. And, the second wafer 210 may be substantially free of being trimmed or cutting.

In some embodiments of the present disclosure, a center TLC of the circle of the trimming line/path TL may be offset from a center 10C of the bonded structure 10 (e.g., centers of the first and second wafers 110 and 210), for example, substantially along a direction X that the notch 10N extending into the bonded structure 10 along. Through the configuration, the trimming line/path TL is spaced apart from the notch 10N, and a large effective area of the bonding region BA of the bonded structure 10 remains after the edge trimming process. For example, a distance DN between the notch 10N and the trimming line/path TL is in a range from about 0.2 millimeters and about 0.9 millimeters in the top view. If the distance DN is less than about 0.2 millimeter, the trimming line/path TL may not be spaced apart from the notch 10N, which may cause the edge cracking issues in a subsequent process. If the distance DN is greater than about 0.9 millimeter, the effective area of the bonding region BA of the bonded structure 10 after the edge trimming process may shrink.

In some embodiments, an offset distance DC between the center TLC of the circle of the trimming line/path TL and the center 10C of the bonded structure 10 may be in a range from about 0.1 millimeter and about 0.7 millimeter. If the offset distance DC is less than about 0.1 millimeter, the trimming line/path TL may not be spaced apart from the notch 10N, which may cause the edge cracking issues in a subsequent process. If the offset distance DC is greater than about 0.7 millimeter, the effective area of the bonding region BA of the bonded structure 10 after the edge trimming process may shrink.

By the offset configuration, the trimming line/path TL and the outermost periphery of the bonded structure 10 have different distance therebetween. In some embodiments, for overcoming the edge cracking issue, the trimming line/path TL and the outermost periphery of the bonded structure 10 have a greatest distance DG near the notch 210N, and a shortest distance DS away from the notch 210N. For example, the greatest distance DG between the trimming line/path TL and the outermost periphery of the bonded structure 10 may be in a range from about 2.3 millimeter to about 3.0 millimeter, and the shortest distance DS between the trimming line/path TL and the outermost periphery of the bonded structure 10 may be in a range from about 1.3 millimeter to about 1.7 millimeter. If the greatest distance DG is less than about 2.3 millimeters, the trimming line/path TL may not be spaced apart from the notch 10N, which may cause the edge cracking issues in subsequent process. If the greatest distance DG is greater than about 3 millimeters, the effective area of the bonding region BA of the bonded structure 10 after the edge trimming process may shrink. If the shortest distance DS is greater than about 1.7 millimeters, the effective area of the bonding region BA of the bonded structure 10 after the edge trimming process may shrink. If the shortest distance DS is less than about 1.3 millimeters, the number of the ugly dies simulated from the effective area of the bonding region BA of the bonded structure 10 may increase.

Figure 8B:
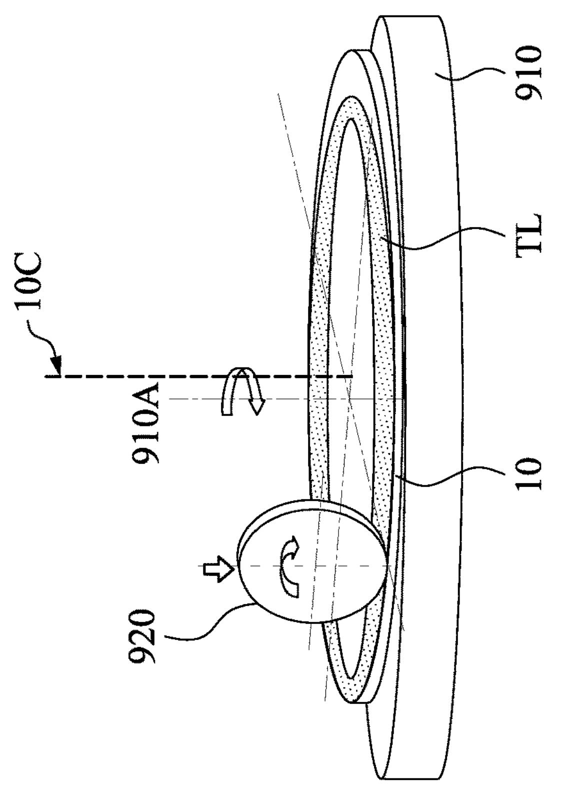
FIGS. 8A and 8B illustrate a semiconductor structure under a mechanical edge trimming process in accordance with some embodiments.
Figure 8A:
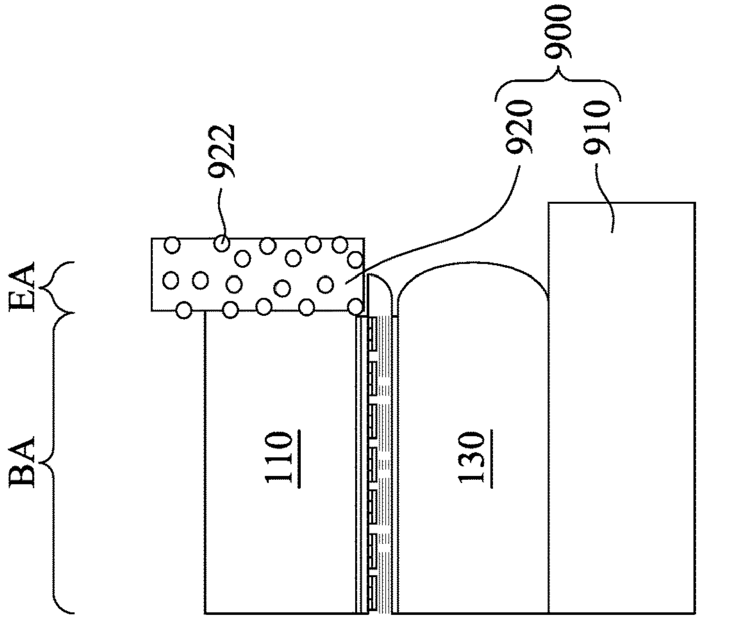
Figure 9:
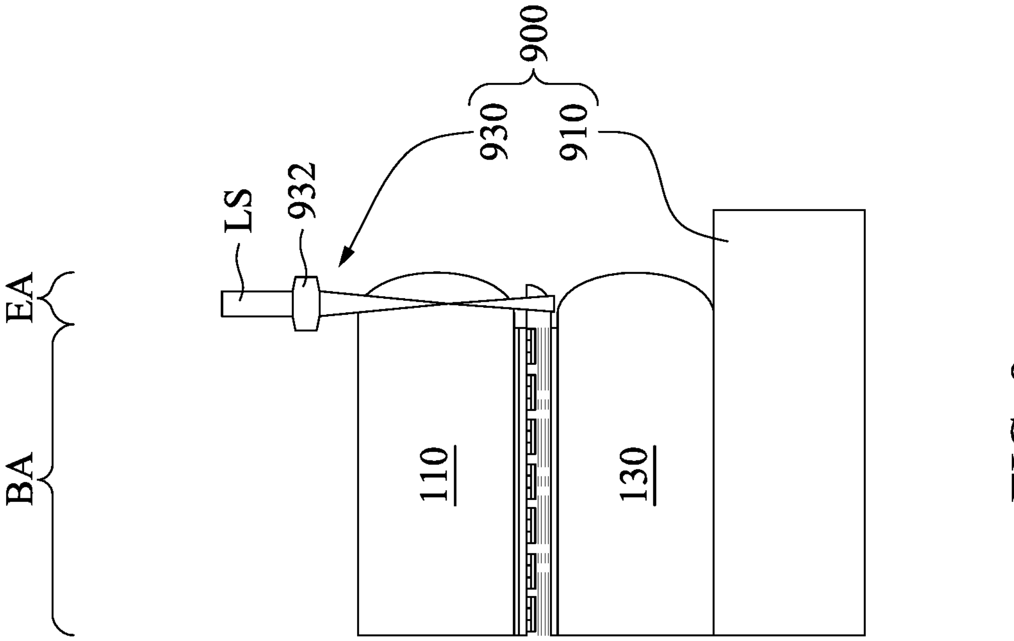
FIG. 9 illustrates a semiconductor structure under a laser edge trimming process in accordance with some embodiments.

A wafer trimming apparatus as illustrated in FIGS. 8A and 8B or FIG. 9 later can be used for the edge trimming process. The wafer trimming apparatus may include a wafer chuck 910 configured to hold the bonded structure 10 and rotate the bonded structure 10 during various steps of the wafer trimming process. For example, the wafer chuck 910 is configured to rotate the bonded structure 10 as a cutting device (e.g., the blade 920 in FIGS. 8A and 8B or the laser device 930 in FIG. 9) is "ON", such that the cutting device can remove the edge region EA1 of the first wafer 110 by rotating the bonded structure 10. The rotation axis 910A of the wafer chuck 910 may extend along direction Z that is orthogonal to the directions X and Y, and substantially overlap the center TLC of the circle of the trimming line/path TL. Like the center TLC of the circle of the trimming line/path TL offset from the center 10C of the bonded structure 10 (or centers of the first and second wafers 110 and 210), the rotation axis 910A may be offset from a center 10C of the bonded structure 10 (or centers of the first and second wafers 110 and 210) by the distance DC.

FIGS. 5A and 5B show a resulted bonded structure after the edge trimming process. After the edge trimming process, the first wafer 110 follows the shape of the circle of the trimming line TL. For example, the first wafer 110 has a center 110C offset from the center 210C of the second wafer 210, which is the same as the center 10C of the bonded structure 10 in FIGS. 4A and 4B before the edge trimming process. After the edge trimming process, the second wafer 210 is exposed in the top view of FIG. 4A.

Reference is made to FIG. 6. A thinning process is performed to remove a portion or an entirety of the first wafer 110. The thinning process may include a suitable backside grinding process, such as a chemical mechanical polish (CMP) process. After the backside grinding process, the FEOL structure 120 (e.g., gates or source/drain structures of the active devices 122) is exposed.

In some cases where the trimming line overlapping the notch of the wafers, the first wafer may have a remaining notch profile after the edge trimming process. With the presence of the remaining notch profile, the backside grinding process may result in edge cracking in the first wafer, which may cause the number of bad dies increases.

In some embodiments of the present disclosure, by offset a center TLC of the circle of the trimming line/path TL (referring to FIG. 4A) from a center 10C of the bonded structure 10, an entity of the notch of the first wafer can be removed by the edge trimming process, thereby preventing the grinding process from the edge cracking issue. It is noted that for brief illustration, the notch profile is not explicitly shown in the cross-sectional views of FIGS. 1B, 2B, 3B, 4B, and 5B.

In some embodiments of the present disclosure, prior to the backside grinding process, a protection layer 300 may be formed on the structure of FIG. 5B. The protection layer 300 may be in physical contact with the first wafer 110, sidewalls of layers between the first and second wafers 110 and 210, and the second wafer 210. The protection layer 300 may include inorganic material, such as SiN, SiC, SiCN, or the like. In some embodiments, the protection layer 300 may include suitable organic material, such as polyimide, polybenzoxazole (PBO), other suitable polymer, or the like. The protection layer 300 has the function of preventing the first semiconductor structure 100 from peeling off from the second wafer 210. In addition, the backside grinding process and subsequent cleaning processes may involve the using of water, and the protection layer 300 can block moisture from penetrating into the multilevel interconnect structure in the BEOL structure 140 from the sidewalls of dielectric layers 142, and may prevent the degradation of the dielectric layers 142 and the conductive elements 144 in BEOL structure 140.

Reference is made to FIG. 7. After the backside grinding process, a backside metallization structure 180 may be formed on the exposed FEOL structure 120 (e.g., the active devices 122). For example, the backside metallization structure 180 may include backside conductive features (e.g., backside contacts) 184 in a dielectric layer 182, in which the backside conductive features 184 may be electrically connected with the gates and/or the source/drain structure of the active devices 122. The backside grinding process may be implemented using a grinding apparatus. In some embodiments, the grinding apparatus is configured to reduce the thickness of the first wafer 110. In some embodiments, the grinding apparatus may be or comprise an apparatus used for chemical mechanical planarization (CMP). In some embodiments, the grinding apparatus may include some kind of grinding wheel that has a diameter larger than a diameter of the first/second wafer 110/210.

FIGS. 8A and 8B illustrate a semiconductor structure under a mechanical edge trimming process in accordance with some embodiments. In the present embodiments, the wafer trimming apparatus 900 includes a blade (or a blade saw) 920 having an abrasive surface for contacting the bonded structure 10. In some embodiments, the wafer chuck 910 is configured to rotate the bonded structure 10 as the blade 920 is "ON" and rotating the bonded structure 10 to remove the edge region EA1 of the first wafer 110. For example, the blade 920 comprise plural diamond particles/grits 922. In some embodiments, with the rotation of the wafer chuck 910, the blade 920 can be configured to rotate with respect to an axis that is normal to a top surface of the bonded structure 10 (e.g., the first wafer 110). In some embodiments, the blade 920 is coupled to control circuitry that operates the blade 920 and controls various parameters (e.g., rotation per minute, location of the blade 920, etc.) of the blade 210 during operation. In some embodiments, the blade 920 is also configured to force the formation of a groove that extends completely through the first wafer 110. Thus, the blade 920 may remove the edge region EA1 of the first wafer 110.

FIG. 9 illustrates a semiconductor structure under a laser edge trimming process in accordance with some embodiments. In the present embodiments, the wafer trimming apparatus 900 is configured to create a stealth damage (SD) region within the first wafer 110. In some embodiments, the wafer trimming apparatus 900 is coupled to control circuitry that operates the stealth laser device 930 and controls the depth at which the SD region is formed within the first wafer 110. In some embodiments, the stealth laser device 930 comprises a laser generator (not shown in figure) for generating pulses of a stealth laser LS and a lens 932 that focuses pulses of the stealth laser LS to effectively form the SD region at a desired depth within the first wafer 110. In some embodiments, the wafer chuck 910 rotates the bonded structure 10 as the stealth laser device 920 is "ON" and forms the SD region around the first wafer 110. In other embodiments, the wafer chuck 910 may remain stationary while the stealth laser device 920 rotates around the bonded structure 10. In some embodiments, the wafer trimming apparatus 900 may further include an infrared camera to align the stealth laser LS to the desired cutting region.

In some embodiments, the wafer trimming apparatus 900 of FIGS. 8A and 8B and/or the wafer trimming apparatus 900 of FIG. 9 may include a detection/monitor device for detecting whether the bonded structure 10 is securely held in a place on the wafer trimming apparatus 900 prior to the edge trimming process. Once an indication from the detection/monitor device that shows bonded structure 10 is securely held in a place on the wafer trimming apparatus 900 is received, the edge trimming process (using the blade 920 or the laser LS) may be performed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an off-center orbit wafer edge trimming path is designed to prevent nonbonding region induced edge cracking. Another advantage is that no need to use bevel seal for gap-filling at bevel. Still another advantage is that the off-center orbit wafer edge trimming path can be achieved by a simplified wafer bonding process. Still another advantage is that a blade saw with diamond particle or laser stealth dicing technique can be used to cut wafer edge along a circular path/orbit.

According to some embodiments of the present disclosure, a method for manufacturing a semiconductor structure is provided. The method includes forming a transistor over a first wafer; bonding the first wafer to a second wafer; trimming an edge region of the first wafer along a circular trimming path, wherein a center of the circular trimming path is offset from a center of the bonded first and second wafers in a top view; after trimming the edge region of the first wafer, thinning down the first wafer; and after thinning down the first wafer, forming a backside conductive feature on the bonded first and second wafers.

According to some embodiments of the present disclosure, a method for manufacturing a semiconductor structure is provided. The method includes forming a transistor over a first wafer; bonding a first wafer to a second wafer; cutting an edge region of the first wafer, such that a center of a remaining region of the first wafer is offset from a center of the second wafer in a top view; and forming a backside conductive feature electrically connected to the transistor.

According to some embodiments of the present disclosure, a method includes bonding a first wafer to a second wafer to form a bonded structure; using a wafer chuck, rotating the bonded structure, wherein a rotation axis of the wafer chuck is offset from a center of the bonded structure; and cutting an edge region of the first wafer during rotating the bonded structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a transistor over a first wafer;
bonding the first wafer to a second wafer;
trimming an edge region of the first wafer along a circular trimming path, wherein a center of the circular trimming path is offset from a center of the bonded first and second wafers in a top view;
after trimming the edge region of the first wafer, thinning down the first wafer; and
after thinning down the first wafer, forming a backside conductive feature on the bonded first and second wafers.

2. The method of claim 1, wherein trimming the edge region of the first wafer is performed such that the circular trimming path is spaced apart from a notch of the second wafer in the top view.

3. The method of claim 2, wherein a distance between the notch of the second wafer and the circular trimming path is in a range from about 0.2 millimeters and about 0.9 millimeters in the top view.

4. The method of claim 1, wherein trimming the edge region of the first wafer is performed such that the center of the circular trimming path is offset from the center of the bonded first and second wafers along a direction that a notch of the first wafer extends along in the top view.

5. The method of claim 1, wherein a distance between the center of the circular trimming path and the center of the bonded first and second wafers in the top view is in a range from about 0.1 millimeter and about 0.7 millimeters in the top view.

6. The method of claim 1, wherein trimming the edge region of the first wafer is performed such that the circular trimming path has a first distance from a first edge of the second wafer and a second distance from a second edge of the second wafer, and the first distance is greater than the second distance in the top view.

7. The method of claim 1, wherein thinning down the first wafer is performed such that the transistor is exposed.

8. The method of claim 1, further comprising:
rotating the first wafer by a wafer chuck when trimming the edge region of the first wafer.

9. The method of claim 1, wherein trimming the edge region of the first wafer is performed using a blade.

10. The method of claim 1, wherein trimming the edge region of the first wafer is performed using a laser.

11. A method, comprising:
forming a transistor over a first wafer;
bonding the first wafer to a second wafer;
cutting an edge region of the first wafer, such that a center of a remaining region of the first wafer is offset from a center of the second wafer in a top view; and
forming a backside conductive feature electrically connected to the transistor.

12. The method of claim 11, wherein a center of a remaining region of the first wafer is offset from a center of the second wafer in a top view.

13. The method of claim 11, wherein cutting the edge region of the first wafer is performed such that a notch of the first wafer is removed.

14. The method of claim 11, wherein cutting the edge region of the first wafer is performed such that a bevel of the first wafer is removed.

15. The method of claim 11, further comprising:
removing the first wafer after cutting the edge region of the first wafer.

16. The method of claim 15, wherein removing the first wafer comprising a grinding process.

17. A method, comprising:
bonding a first wafer to a second wafer to form a bonded structure, wherein a backside of the first wafer faces the second wafer;
using a wafer chuck, rotating the bonded structure, wherein a rotation axis of the wafer chuck is offset from a center of the bonded structure;
cutting an edge region of the first wafer during rotating the bonded structure; and
performing a grinding process on the backside of the first wafer after cutting the edge region of the first wafer.

18. The method of claim 17, further comprising:
forming a transistor on a frontside of the first wafer prior to bonding the first wafer to the second wafer; and
forming a backside conductive feature on the backside of the first wafer after the grinding process.

19. The method of claim 17, wherein bonding the first wafer to the second wafer is performed such that a notch of the first wafer is aligned with a notch of the second wafer.

20. The method of claim 17, wherein cutting the edge region of the first wafer is performed such that the second wafer is substantially free of cutting.

* * * * *